(12) United States Patent
Maeda et al.

(10) Patent No.: US 7,658,815 B2
(45) Date of Patent: Feb. 9, 2010

(54) PLASMA PROCESSING APPARATUS CAPABLE OF CONTROLLING PLASMA EMISSION INTENSITY

(75) Inventors: Kenji Maeda, Kudamatsu (JP); Kenetsu Yokogawa, Tsurugashima (JP); Tadamitsu Kanekiyo, Kudamatsu (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 12/105,018

(22) Filed: Apr. 17, 2008

(65) Prior Publication Data
US 2008/0210376 A1 Sep. 4, 2008

Related U.S. Application Data

(63) Continuation of application No. 11/065,078, filed on Feb. 25, 2005, now abandoned.

(30) Foreign Application Priority Data
Feb. 1, 2005 (JP) ............................. 2005-025333

(51) Int. Cl.
*C23F 1/02* (2006.01)
*C23C 16/513* (2006.01)
(52) U.S. Cl. .................. 156/345.24; 118/712
(58) Field of Classification Search ................. None
See application file for complete search history.

(56) References Cited
U.S. PATENT DOCUMENTS 4,859,277 A * 8/1989 Barna et al. ................. 438/7
5,773,820 A   6/1998 Osajda et al.
6,503,364 B1 * 1/2003 Masuda et al. .......... 156/345.24
2001/0014520 A1 * 8/2001 Usui et al. ................. 438/586
2001/0015175 A1   8/2001 Masuda et al.
2004/0197938 A1 * 10/2004 Saito .............................. 438/9
2004/0200718 A1 * 10/2004 Oh et al. ..................... 204/164
2004/0235310 A1 * 11/2004 Usui et al. ................. 438/710

FOREIGN PATENT DOCUMENTS

JP    07-086179 A    3/1995
JP    08-167588 A    6/1996

\* cited by examiner

*Primary Examiner*—Allan Olsen
(74) *Attorney, Agent, or Firm*—Antonelli, Terry, Stout & Kraus, LLP.

(57) ABSTRACT

An antenna electrode having a substantially circular shape, is arranged on a plane of a processing vessel, which is located opposite to a stage for mounting a sample within the processing vessel, and positioned parallel to the stage. An emission monitor monitors emission intensity of plasma present in at least 3 different points along a radial direction of the antenna electrode. A control unit adjusts an energizing current supplied to an external coil for forming a magnetic field within the processing vessel. The control unit adjusts the energizing current supplied to the external coil based upon the monitoring result obtained from the emission monitor so as to control the emission intensity of the plasma to become uniform emission intensity.

2 Claims, 4 Drawing Sheets

PLASMA PROCESSING APPARATUS CAPABLE OF CONTROLLING PLASMA EMISSION INTENSITY

CROSS REFERENCE TO RELATED APPLICATION

This application is a Continuation of U.S. application Ser. No. 11/065,078, filed Feb. 25, 2005 now abandoned, which claims priority from Japanese Patent Application No. 2005-025333, filed Feb. 1, 2005, the contents of which are incorporated herein by reference.

BACKGROUND OF THE INVENTION

The present invention generally relates to a plasma processing technique. More specifically, the present invention is directed to a plasma processing technique capable of uniformly processing samples.

In semiconductor device manufacturing methods, plasma processing apparatus have been widely used in film forming steps and etching steps. As to these plasma processing apparatus, high-precision processing operations and mass production stabilities are required in correspondence with devices which should be manufactured in very fine manners. On the other hand, diameters of wafers to be processed are being enlarged in view of improvements in productivity. Nowadays, the major wafer diameter becomes 300 mm. In correspondence with large diameters of wafers, higher processing uniformity within planes of wafers is required in these plasma processing apparatus.

A factor which may give the largest influence to the processing uniformity is uniformity of plasma. To control plasma distributions in order to obtain uniform plasma, two different methods have been proposed. That is, as to one method, while two sets, or more sets of high frequency power systems are prepared so as to generate plasma, a ratio of supplying electric power to these high frequency power systems is controlled, and as to the other method, mutual reactions between magnetic fields and electromagnetic waves are employed.

Also, such an idea of a plasma processing apparatus equipped with a plasma monitoring means has been processed. For instance, JP-A-8-167588 describes that while a current is supplied to an auxiliary coil in response to a comparison result between the reference distribution condition and a distribution condition of plasma density acquired from the plasma monitoring means, the plasma contained in a reaction chamber is brought into the reference distribution condition.

Further, JP-A-7-86179 discloses that while emission distributions of plasma are acquired from detection signals of photosensors, supplying of electric power to the respective antennas is controlled in such a manner that the acquired emission distributions may become a uniform distribution.

SUMMARY OF THE INVENTION

In the plasma processing apparatus described in JP-A-8-167588, the uniformity as to plasma is monitored by processing image signals derived from a CCD camera. However, a huge amount of cost is required in order to realize the monitoring method shown in this plasma processing apparatus, and complex operations are required when image processing operations are carried out. As a consequence, this conventional plasma processing apparatus can be hardly applied to semiconductor manufacturing apparatus used in mass production. Also, in order that plasma is captured as an image by using the CCD camera, a relatively large-sized window must be mounted on a wall of a vacuum vessel. However, if such a large-sized window is mounted, then the uniformity of plasma is deteriorated. Also, deposited films are adhered and/or are scratched on the above-described window, so that these deposited films may fog up the window itself. As a result, the window of the vacuum vessel provided in this conventional plasma processing apparatus may not be possibly used for a long time period.

On the other hand, the plasma processing apparatus described in JP-A-7-86179 owns a merit as to cost and simple operations, as compared with the above-explained plasma processing apparatus equipped with the CCD camera. However, in the conventional plasma processing apparatus of JP-A-7-86179, no care should be taken in long-term stabilities thereof when this conventional plasma processing apparatus is applied to mass production apparatus. Also, the conventional plasma processing apparatus of JP-A-7-86179 cannot be properly used so as to manufacture semiconductor devices in very fine manners. In other words, there is such a reason that this conventional plasma processing apparatus employs the frequency range of approximately 2.45 GHz as the electromagnetic waves used to generate the plasma. Although the publication of JP-A-7-86179 does not clearly describe the frequency under use, this publication apparently employs such a technical background that microwaves are employed so as to generate the plasma because of the following technical points. That is, the triangular plates are combined with respect to the plural antennas, and the helical antenna is employed. Further, the uniformity of plasma can be controlled based upon the lengths of the cables which connect these plural antennas to the power supply.

The electron temperatures in the plasma sources using the microwaves are increased, so that the dissociation of the processing gas is excessively progressed. As a result, as to the long-term stability, there is such a demerit that selectivity of the mask and substrate is deteriorated. In other words, if such a plasma source using the microwaves as shown in JP-A-7-86179 is employed in a plasma processing apparatus, then this plasma processing apparatus can hardly manufacture current semiconductor devices in very fine manners.

In addition, the publication of JP-A-7-86179 describes that the electric power supplied to the respective antennas is controlled as the means for adjusting the plasma distributions in response to the signals derived from the monitor. However, the following means can be hardly realized in an actual case. That is, it is practically difficult that high frequency power for generating plasma in frequency ranges from several tens of MHz to several GHz is subdivided in high precision, and a subdividing ratio of this high frequency power is control in a simple manner. As a result, under a practically acceptable condition, plural sets of high frequency power supplies whose quantity is equal to a total number of these antennas must be equipped. This may also increase the total cost.

The present invention has been made to solve these problems of the above-described conventional techniques, and therefore, has an object to provide a plasma processing technique capable of processing samples in a uniform manner in correspondence with very fine devices.

To solve the above-described problems, a plasma processing apparatus, according to an aspect of the present invention, is featured by comprising: a processing vessel, the pressure of which can be lowered; a stage for mounting a sample within the processing vessel; an antenna electrode having a substantially circular shape, arranged on a plane of the processing vessel, which is located opposite to the stage, and positioned parallel to the stage; a gas conducting unit for supplying processing gas into the processing vessel; an external coil which forms a magnetic field within the processing vessel and produces plasma within the processing vessel due to a mutual reaction occurred between the formed magnetic field and an electromagnetic wave radiated from the antenna electrode; an emission monitor for monitoring emission intensity of plasma present in at least 3 different points along a radial direction of the antenna electrode; and a control unit for adjusting an energizing current supplied to the external coil; in which the control unit adjusts the energizing current supplied to the external coil based upon the monitoring result obtained from the emission monitor so as to control the emission intensity of the plasma to become uniform emission intensity.

Since the plasma processing apparatus of the present invention is arranged with the above-described structural elements, such a plasma processing technique capable of uniformly plasma-processing very fine devices in high precision can be provided.

Other objects, features and advantages of the invention will become apparent from the following description of the embodiments of the invention taken in conjunction with the accompanying drawings.

DETAILED DESCRIPTION OF THE EMBODIMENTS

Figure 1:
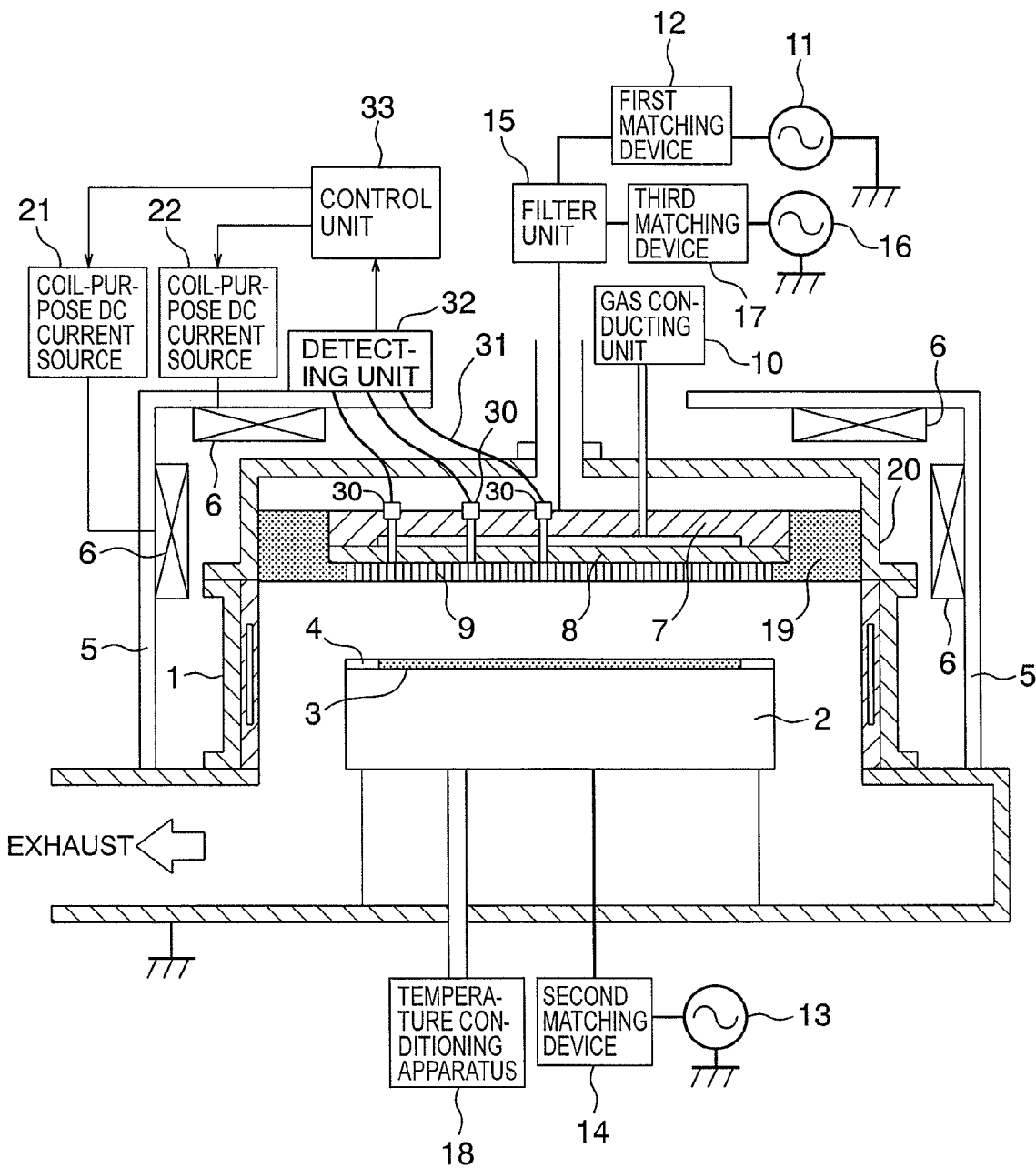
FIG. 1 is an explanatory diagram for explaining a plasma processing apparatus according to an embodiment of the present invention.

Referring now to drawings, best embodiment modes of the present invention will be described. FIG. 1 is a diagram for explaining a plasma processing apparatus according to an embodiment of the present invention. As represented in this drawing, a wafer mount-purpose stage 2, the temperature of which has been conditioned by a temperature conditioning apparatus 18, is provided inside a vacuum processing chamber 1 having a gas conducting unit 10, while the vacuum processing chamber 1 has been vacuum-exhausted, and a substantially circular shaped antenna electrode 7 is provided on a plane which is located opposite to this wafer mount-purpose stage 2, and the antenna electrode 7 is positioned parallel to the stage 2. High frequency power is supplied by a first high frequency power supply 11 via a first matching device 12 to the antenna electrode 7, and then plasma is generated by way of a mutual reaction between electromagnetic waves radiated from the antenna electrode 7 and magnetic fields which are formed by an external coil 6 and a yoke 5. Under this condition, a high frequency bias voltage is supplied from a second high frequency power supply 13 via a second matching device 14 to a wafer 3 to be processed, so that a plasma processing operation can be carried out. The second high frequency power supply 13 has been connected to the wafer mount-purpose stage 2.

A third high frequency power supply 16 has been connected via both a filter unit 15 and a third matching device 17 to the antenna electrode 7. Also, both a gas distributing plate 8 and a shower plate 9 have been installed so as to uniformly supply the gas conducted from the gas conducting unit 10 to the vacuum processing chamber 1.

While a monitoring unit 30 for monitoring an emission distribution from plasma has been provided with the antenna electrode 7, the emission distribution acquired by the monitoring unit 30 is inputted via an optical fiber 31 to a detecting unit 32. An emission distribution signal detected by the detecting unit 32 is entered to a control unit 33. The control unit 33 controls DC power supplies 21 and 22 in response to the acquired emission distribution.

Next, the respective structural elements of the plasma processing apparatus according to this embodiment will now be described in detail.

First, a description is made of structural elements provided around the antenna electrode 7. A frequency of the first high frequency power supply 11 which is employed so as to generate and maintain plasma just above the wafer 3 to be processed is selected to be frequencies between 100 MHz and 500 MHz. If the selected frequency is excessively low, then a plasma stability in the sub-Pascal pressure region is deteriorated, and also, plasma density which is sufficiently high for plasma processing operation cannot be obtained. On the other hand, if the selected frequency is excessively high, then non-uniformity of plasma may become conspicuous due to such a fact that a wavelength of an electromagnetic wave becomes short. Also, in the microwave range, electron temperature is increased, and excessive dissociation of processing gas may occur.

As a consequence, since the above-explained frequency range (namely, from 100 MHz to 500 MHz) is employed, such a plasma whose density is medium may be generated just above a wafer in a high efficiency in pressure regions defined from 0.2 Pa to 20 Pa which are employed in plasma processing operation. In the example of FIG. 1, the frequency of the first high frequency power supply has been selected to be 200 MHz.

It should also be understood that as to the plasma generated by the electromagnetic waves in the above-explained frequency range, the electron temperature thereof is lower than that of microwave ECR plasma, or inductively coupled plasma, and thus, there is such an effect that excessive dissociation of processing gas can be avoided.

Now, a description is made of such an example that an insulating film such as a silicon oxide film is etched. Since multiple dissociation is caused to occur by plasma having a high electron temperature, CF-series gas which is employed to etch the insulating film produces a large amount of F (Fluorine) radicals which lowers the selectivity of the insulating film to a silicon nitride film as an etch-stop layer, or to a resist as a mask material. However, as to the plasma which has been generated in the above-described frequency range, the electron temperature thereof is low, so that the plasma may be generated in the medium density by properly adjusting source power, and such a dissociation condition suitable for high selectivity process can be realized.

Also, if a material of a surface of the antenna electrode 7 which is made in contact with plasma is properly contrived, then a further improvement of a selectivity may be expected.

In the example of FIG. 1, the shower plate 9 made of silicon was employed on the surface of the antenna electrode 7 on the side of the stage 2. Several hundreds of very fine holes whose diameters are selected to be approximately 0.3 mm to 0.8 mm have been pierced in the shower plate 9 made of silicon. Furthermore, such a gas distributing plate 8 has been installed between the shower plate 9 and the antenna electrode 7, in which several hundreds of very fine holes whose diameters are selected to be approximately 0.3 mm to 1.5 mm have been pierced. While a space between the gas distributing plate 8 and the antenna electrode 7 constitutes a buffer chamber of the processing gas, the processing gas supplied from the gas supplying system 10 is uniformly conducted via both the gas distributing plate 8 and the shower plate 9 made of silicon into the processing chamber.

It should also be noted that when the silicon oxide film, or the like is etched by employing the plasma processing apparatus of FIG. 1, the below-mentioned gas is mixed with each other to be used as the processing gas: That is, the CF-series gas such as $C_4F_8$, $C_5F_8$, $C_4F_6$, $C_3F_6$, $CF_4$, $CHF_3$, $CH_2F_2$, and $CH_3F$; buffer gas such as Ar, Xe, and $N_2$; and $O_2$ are mixed with each other. In addition, with respect to such a process which requires a higher selectivity, CO gas is added to the above-explained gas series, and the resulting gas series is employed.

As a merit that the surface material of the antenna electrode 7 which is contacted to the plasma is made of silicon, the F (Fluorine) radicals contained in the gas phase, which may cause the selectivity to be lowered when the silicon oxide film is etched, can be removed due to reactions between silicon and the F radicals.

Also, in the example shown in this drawing, the third high frequency power supply 16 for the antenna biasing operation has been connected to the antenna electrode 7 via the filter unit 15 and the third matching device 17. In this case, the frequency of the third high frequency power supply 16 for the antenna biasing operation is selected to be preferably frequencies between 100 KHz and 20 MHz, and is selected to be more preferably frequencies between 400 KHz and 13.56 MHz in order not give an adverse influence to the plasma generated by the first high frequency power. The filter unit 15 may suppress that the first high frequency power is detoured to the third high frequency power supply 16, and also, the third high frequency power of the third high frequency power supply 16 is detoured to the first high frequency power supply 11. In this example, the frequency of the third high frequency power supply 16 has been selected to be 4 MHz.

As previously explained, since the antenna bias voltage is applied by employing the third high frequency power supply 16, the reactions for removing the F radicals on the surface of the antenna electrode 7 can be controlled in the independent manner with respect to the plasma density. As a result, very fine patterns can be formed in high precision.

In the example of FIG. 1, the silicon material has been employed as the surface of the antenna electrode 7 on the side of the stage 2. Other materials may be alternatively employed, depending upon subjects to be etched, for instance, silicon carbide, glassy carbon, quartz, Anodized Aluminum, polyimide, and the like may be employed.

It should also be noted that the temperatures of the antenna electrode 7 and the side wall of the processing vessel 1 are controlled at constant temperatures. As a result, the process performance can be kept for a long time under stable condition.

Next, a description is made of arrangements provided around the wafer mount-purpose stage 2. The second high frequency power supply 13 has been connected to this stage 2, while the second high frequency power supply 13 is used to apply the high frequency bias voltage to a wafer so as to draw ions to the wafer. A frequency of this second high frequency power supply 13 is selected to be preferably frequencies between 100 KHz and 20 MHz, and is selected to be more preferably frequencies between 400 KHz and 13.56 MHz in order that an adverse influence is not given to the plasma generated by the first high frequency power of the first high frequency power supply 11, and also, the ions are drawn in a high efficiency. In the example shown in this drawing, the frequency of the second high frequency power supply 13 was set to 4 MHz.

In order to further control a density distribution of activated seeds contained in a gas phase, a focus ring 4 having a substantially ring shape has been arranged at an outer peripheral portion of the stage 2 in such a manner that this focus ring 4 surrounds the wafer 3. In the example shown in this drawing, silicon has been employed as a material of the focus ring 4. It should also be understood that although the average density of the F radicals contained in the gas phase may be controlled by controlling the antenna bias voltage, since the focus ring 4 is equipped, the density distribution of the F radicals within the plane of the wafer 3 can be precisely controlled.

The F radicals which have been generated by the multiple dissociation of the processing gas is also consumed by the resist on the surface of the wafer 3. In the case that such a member capable of consuming the F radicals is not set in the outer-sided region of the wafer 3, density of the F radicals as to an outer peripheral portion of the wafer 3 becomes higher, as compared with that as to a center portion of the wafer 3. However, the above-described focus ring 4 may have an effect capable of suppressing this density increase.

Furthermore, since wafer biasing electric power is branched and applied to the focusing ring 4, the F radical density suppressing effect achieved at the outer peripheral portion of the wafer 3 can be increased. In the example shown in this drawing, silicon has been employed as the material of this focus ring 4. Other materials may be alternatively employed, depending upon subjects to be etched, for instance, silicon carbide, glassy carbon, quartz, Anodized Aluminum, polyimide, and the like may be employed.

Although not shown in the drawing, two conducting passages for the processing gas may be alternatively employed, so that a distribution of the activated seeds contained in the gas phase may be controlled.

Next, a description is made of a monitor control system for a plasma distribution. The monitor control system is provided with the monitoring unit 30, a detecting unit 32, and a control unit 33.

The monitoring unit 30 plays a role of conducting plasma emission at a desirable position outside the process chamber 1. The monitoring unit 30 is constituted by arranging a rod made of quartz in such a manner that this quartz rod penetrates through both the antenna electrode 7 and the distributing plate 8. A lower end of the quartz rod is positioned at the rear surface of the shower plate 9, while a plurality of light conducting holes whose diameters are selected to be approximately 0.4 mm to 1.0 mm have been pierced in the shower plate 9 in such a manner that these light conducting holes are made coincident with the lower end of the quartz rod.

It is preferable to decrease a total number of the above-described light conducting holes, and also desirable to reduce the diameters of these light conducting holes in such a range that intensity of plasma emission can be measured in a quantitative manner. It should also be understood that the above-explained light conducting holes may be alternatively replaced by the gas supplying holes pierced in the shower plate 9.

Since such a structure is employed, the lower end portion of the quartz rod is not directly exposed to the plasma, so that a change in light conducting amounts can be suppressed, while this light conducting amount change is caused by consumption, or sputtered spots of surfaces of the quartz rod, or a deposited article. In the example shown in this drawing, quartz has been employed as the material of the rod. Alternatively, heat resisting glass, a sapphire, and the like may be employed. Also, such a rod having a lower end which has been coated by a thin film made of alumina, yttria, or yttrium may be alternatively employed instead of this quartz rod. Since such a rod having the thin-film coated lower end is employed, durability with respect to such a plasma which is slightly leaked via the light conducting holes may be improved.

In the example shown in this drawing, since the plasma processing apparatus for processing such a wafer whose diameter is 300 mm is set as an initial condition, three pieces of the quartz rods have been arranged at a position (center portion) of a radius: 20 mm, another position (intermediate portion) of a radius 80: mm, and a further position (outer peripheral portion) of a radius: 140 mm, which are separated from the center of the antenna electrode 7. Alternatively, positions for arranging the quartz rods may be properly set, depending upon a wafer size. Also, a total number of such quartz rods, namely a total point used to monitor plasma emission is properly selected to be approximately 3 to 5 at radial positions. As apparent from the foregoing description, a 3-point monitoring method may have a merit of a cost aspect, whereas a 5-point monitoring method may have a merit of a precision aspect.

Figure 2A:
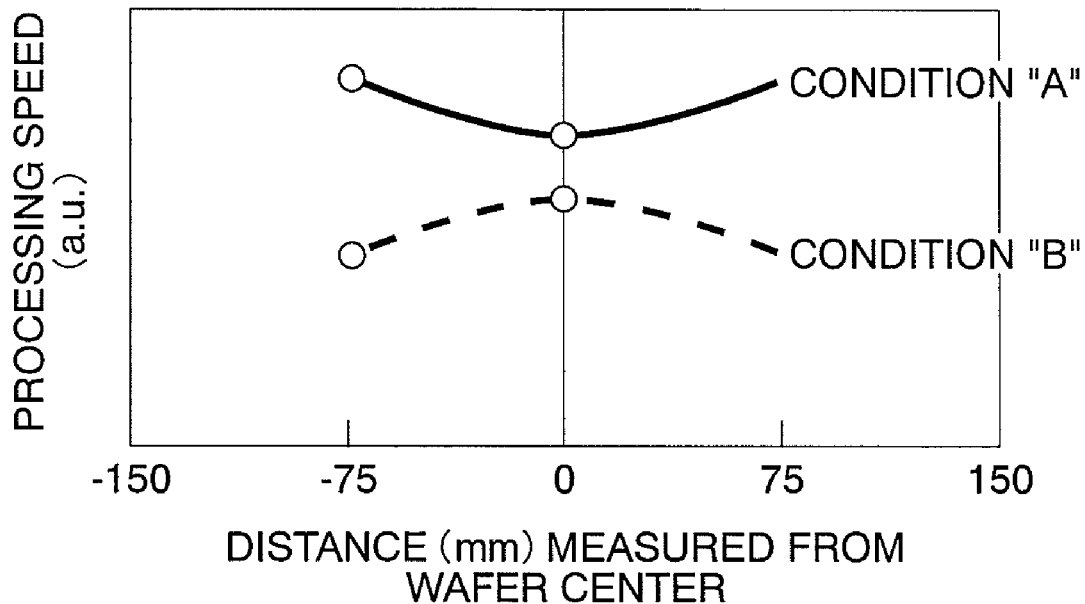
FIG. 2A and FIG. 2B are diagrams for graphically explaining processing speed distributions within planes of wafers.
Figure 2B:
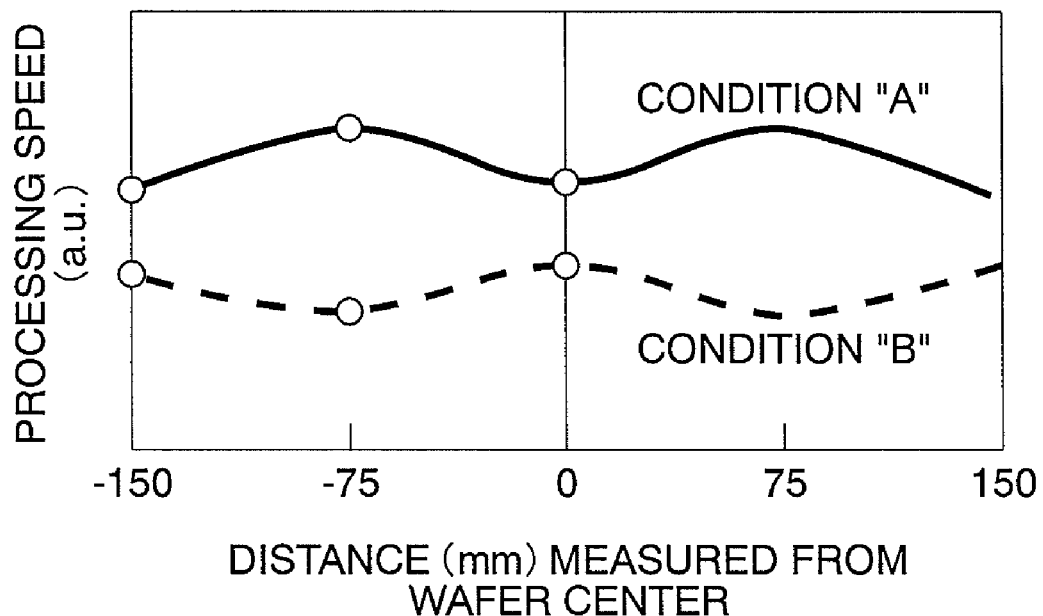

Next, a description is made as to a reason why plasma emission must be monitored at three points at a minimum in order that the plasma processing apparatus according to this embodiment is capable of processing a wafer whose diameter is larger than, or equal to 300 mm. In this connection, FIG. 2 is an explanatory diagram for explaining distributions of processing speeds within surfaces of wafers. FIG. 2A is an explanatory diagram for explaining a distribution of processing speeds in a wafer, the diameter of which is smaller than, or equal to 150 mm. FIG. 2B is an explanatory diagram for explaining a distribution of processing speeds in a wafer, the diameter of which is larger than, or equal to 300 mm.

In a conventional plasma processing apparatus capable of processing a wafer whose diameter is smaller than, or equal to 150 mm, as shown in FIG. 2, there are many cases that the processing speed distribution within the surface of the wafer becomes either a simple convex distribution or a simple concave distribution. That is, since the wafer size is small, non-uniformity of plasma do not become conspicuous. On the other hand, as to the wafer size having the diameter larger than, or equal to 300 mm, as represented in FIG. 2B, there are some possibilities that the processing speed distribution within the wafer surface may not become the above-described simple convex/concave distributions, but may become such complex distribution shapes as an M-shaped distribution, or a W-shaped distribution. In other words, in order to define these complex distribution shapes, three monitoring points are necessarily required at a minimum.

Subsequently, with respect to adverse influences given to judging accuracy as to uniformity of processing operations executed in monitoring points, investigation results thereof will now be explained. In this case, the expression "uniformity" corresponds to an amount which is expressed by:

$$(\text{Max}(Ri) - \text{Min}(Ri))/(\text{Max}(Ri) + \text{Min}(Ri)) * 100(\%), i=1, 2, \text{---}.$$

Symbol "Ri" shows a processing speed at a certain measurement point "i" on a wafer.

Among all of processed results (namely, 266 processed results) under various conditions, which were acquired by employing the plasma processing apparatus capable of processing a wafer whose diameter is 300 mm, according to the embodiment of the present invention, there were 74 processed results in which uniformity of two monitoring points data as to a center portion and an outer peripheral portion was smaller than, or equal to ±5%. Among these processed results, there were 38 processed results in which processing uniformity within the surface of the wafer was smaller than, or equal to ±5%. On the other hand, there were 47 processed results in which uniformity of three monitoring points data as to a center, an intermediate portion, and an outer peripheral portion was smaller than, or equal to ±5%.

That is to say, in the case that the uniformity of the 2-monitoring points data is evaluated to become smaller than, or equal to ±5%, a ratio of actual processing uniformity (smaller than, or equal to ±5%) of the processing uniformity within the wafer surface to the entire processing uniformity is only approximately 51%. In contrast, in the case that the uniformity of the 3-monitoring points data is evaluated to become equal to ±5%, a ratio of actual processing uniformity (smaller than, or equal to ±5%) of the processing uniformity within the wafer surface to the entire processing uniformity may be improved to become 81%. As apparent from the foregoing explanation, if the monitoring points are increased from 3 points to 4 points, or 5 points, then accuracy can be furthermore increased.

Also, in the example shown in this drawing, since the first high frequency power of the first high frequency power supply 11 is applied to the center of the antenna electrode 7, the monitoring-purpose quartz rod which should be arranged at the center portion of the antenna electrode 7 has been arranged at the radial position of 20 mm. Alternatively, the power feeding unit of the first high frequency power supply 11 may be slightly shifted from the center portion, the quartz rod of the center portion may be arranged at a radial position of zero mm. Further, the quartz rod of the center portion may be alternatively and slightly titled toward a direction of r=0 mm. Even in any of the above-described alternative case, emission of the center portion of the wafer may be acquired, so that monitoring precision may be increased.

The emission from the plasma detected by the monitoring unit 30 is connected via an optical fiber 31 to the detecting unit 32. The detecting unit 32 is constructed of three photodiodes. If any devices own functions capable of converting an optical signal into an electric signal, then the detecting unit 32 may employ not only such a photodiode, but also a CCD element, a photomultiplier, and the like. Alternatively, a spectroscope may be installed so as to monitor light in a spectroscopic manner. In this alternative case, not only a plasma distribution may be merely acquired, but also, a radial-direction distribution of a certain radical seed may be grasped.

The emission information which has been emitted from the plasma and has been converted into the electric signal is A/D-converted into digital emission data, and thereafter, this digital emission data is entered to the control unit 33. The control unit 33 controls a coil-energizing DC current source 21 and a coil-energizing DC current source 22 based upon a plasma distribution. In the example shown in this drawing, the following experimental fact is known. That is, when a magnetic field is made strong, plasma becomes an outer higher distribution, whereas when a magnetic field is made weak, plasma becomes a center higher distribution. As a consequence, in the case that emission intensity in the center portion is high, the control unit 33 controls the coil-energizing DC current sources 21 and 22 along such a direction for strengthening the magnetic field. Conversely, in the case that emission intensity in the outer peripheral portion is high, the control unit 33 controls the coil-energizing DC current sources 21 and 22 along such a direction for weakening the magnetic field.

Alternatively, since coils of plural systems to which different currents are supplied are employed, for instance, coils of two systems are employed, not only strengths of magnetic fields may be changed, but also shapes of magnetic force lines may be changed, so that the control unit 33 may control plasma distributions in higher precision. In other words, the control unit 33 may alternatively correct not only the simple outer higher distribution and the simple center higher distribution, but also may alternatively correct an M-type distribution and a W-type distribution.

Figure 3:
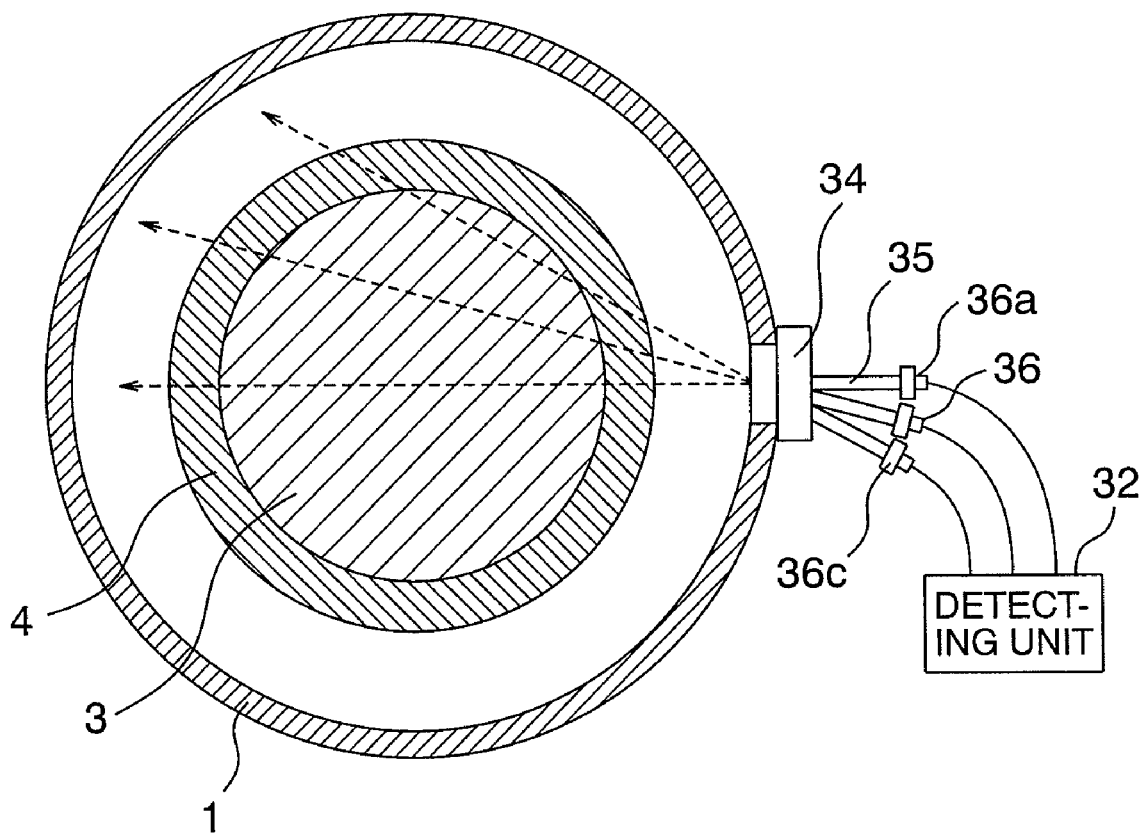
FIG. 3 is an explanatory diagram for illustratively explaining an example in which a monitor unit is arranged on a side plane of a processing vessel 1.

FIG. 3 is an explanatory diagram for explaining an example in which a monitoring unit 34 is arranged on a side plane of the processing vessel 1. It should also be noted that the yokes, the coils, the power supplies, and the like have been omitted for the sake of a simple explanation. The side-plane monitoring unit 34 has been mounted at such a position which is located higher than a wafer plane of a side wall of the processing chamber 1, and also, is located lower than the lower plane of the shower plate 9. The side-plane monitoring unit 34 is equipped with a metal pipe 35 mounted on the processing vessel 1, and a quartz window 36 has been mounted on an edge of this metal pipe 35, which is located opposite to the processing vessel 1. Since the metal pipe 35 is provided, an incident solid angle of emission which is entered to the quartz window 36 is restricted, so that only plasma emission emitted from a desirable position can be acquired.

In other words, plasma emission emitted from the center portion of the processing vessel 1 is entered to a quartz window 36a, whereas plasma emission emitted from the peripheral portion of the processing chamber 1 is entered to another quartz window 36c. Also, since the quartz window 36 is not directly exposed to plasma having high density by way of the metal pipe 35, it is possible suppress articles deposited on the quartz window 36 and also suppress chipping of the quartz window 36 itself.

In such a case that the side-plane monitoring unit 34 is arranged as shown in FIG. 3, the emission distribution obtained from the quartz window 36 may become such an emission distribution to which the plasma distribution has been indirectly reflected, which is different from such a case that the monitoring unit is provided with the antenna electrode 7. In other words, this is because an integrated value of emission along the radial direction is entered to the quartz window 36. In order to grasp a correct plasma distribution, such an operation as Abelian transformation must be carried out. Since this operation is carried out by the control unit 32, the control unit 32 can execute such a control operation by which the plasma distributions become uniform. While an emission intensity distribution under such a condition that plasma becomes uniform is previously acquired, the control unit 33 may perform such a control operation that the plasma distribution becomes uniform by controlling a magnetic field in such a manner that deviation between the previously-acquired emission intensity distribution and an actually-measured emission intensity distribution may become minimum.

As previously explained, in such a case that the monitoring unit 34 is arranged on the side plane of the processing vessel 1, although the data process operation slightly becomes cumbersome, the construction around the antenna electrode 7 may be simplified, which may achieve a merit of the cost aspect.

Figure 4:
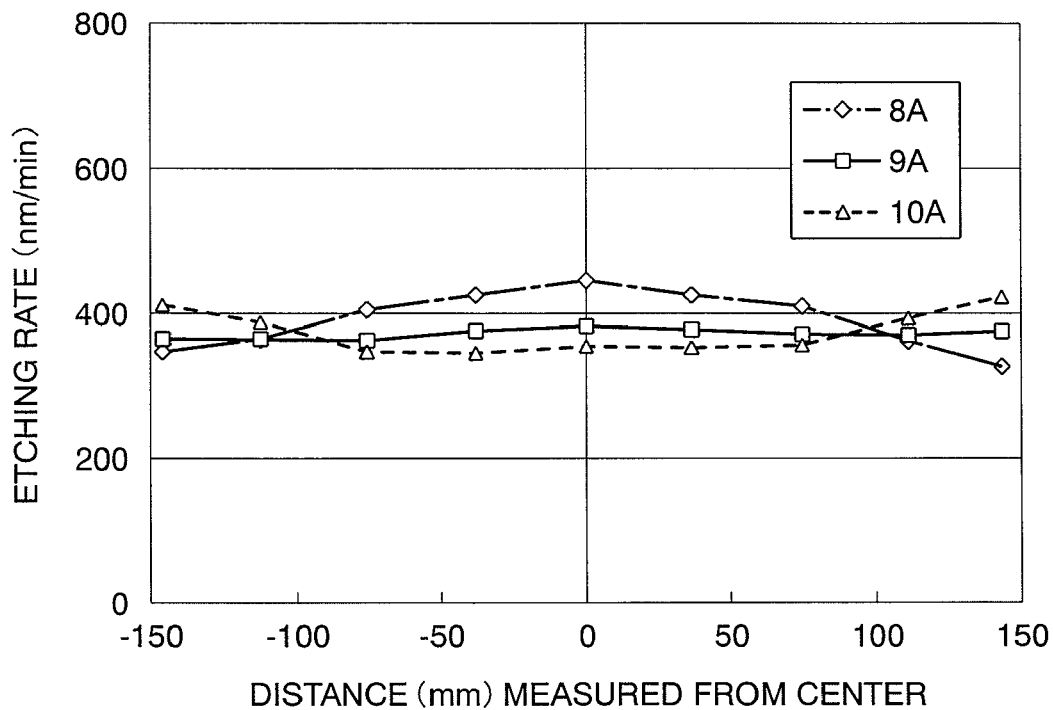
FIG. 4 is a diagram for graphically representing an example of an etching result obtained in the case that a flat sample of a silicon oxide film is etched by employing mixture gas made of $C_4F_8/Ar/O_2$ by the plasma processing apparatus shown in FIG. 1.

Next, a description is made of results which were obtained by actually performing plasma processing operations with employment of the plasma processing apparatus according to this embodiment. FIG. 4 is a diagram for graphically representing an example of etching results obtained when a flat sample of a silicon oxide film was etched by employing mixture gas made of $C_4F_8/Ar/O_2$.

Page 7

As indicated in FIG. 4, the following fact can be revealed. That is, since a current supplied to the coil 6 is adjusted so as to adjust an averaged magnetic field strength, an etching rate distribution can be controlled to become a convex type distribution (coil current being 8 A), a flat type distribution (coil current being 9 A), and a convex type distribution (coil current being 10 A). It should be understood that as to uniformity of the etching rates, uniformity of the convex type distribution was 15%; uniformity of the flat type distribution was 5%; and uniformity of the concave type distribution was 10%. Similar to the above-explained case, also, in this case, the etching rate distribution may be controlled from a center higher distribution via an uniform distribution to an outer higher distribution in accordance with such a condition that the strength of the magnetic field is increased.

Further, while a ratio of currents which are supplied to the coils of the two systems is changed, not only an averaged magnetic field strength is adjusted, but also shapes of magnetic force lines are adjusted, so that resulting uniformity can be furthermore improved.

Figure 5:
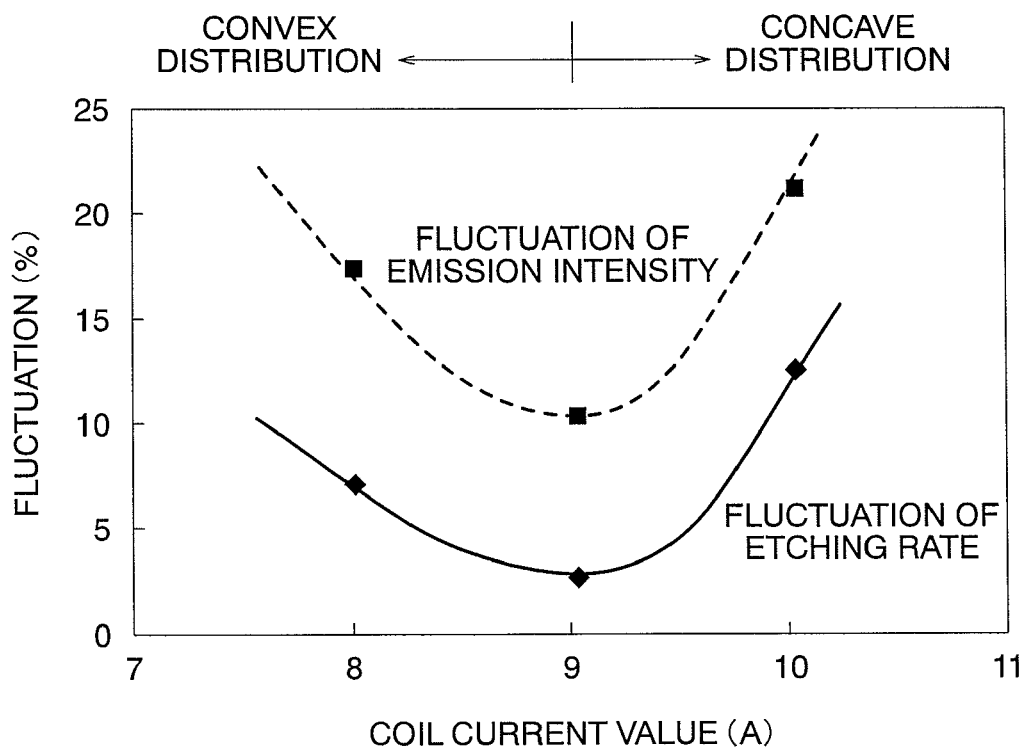
FIG. 5 is an explanatory diagram for graphically explaining a correspondence relationship between uniformity of an emission intensity distribution monitored by the monitor unit of the plasma processing apparatus shown in FIG. 1, and uniformity of an actual etching rate distribution.

FIG. 5 is an explanatory diagram for explaining a correspondence relationship between uniformity of an emission intensity distribution measured by the monitoring unit of the plasma processing apparatus and uniformity of an actual etching rate distribution. As indicated in this explanatory diagram, in a coil current where a fluctuation of the emission intensity distribution owns a minimal value, a fluctuation of the etching rate distribution becomes a minimal value. In other words, it can be understood that in this current value, uniform processing operation can be realized.

As previously explained, in accordance with this embodiment, the efficiency at which the optimum condition of the specific process operation is searched can be considerably increased. As a consequence, the resources which are consumed in order to obtain the optimum condition of the process operation, for instance, sample wafer cost, time, personnel expenses, and the like can be reduced.

Normally, when an optimum condition is determined, many sample wafers are actually etched. In this case, in order to satisfy such requests as a processing speed and a selectivity, when various parameters such as a gas composition ratio, a gas flow rate, and source power are changed, there are some possibilities that uniformity of process operations within a surface of a wafer is deteriorated. This is occasionally caused by that since a discharge condition is changed, uniformity of plasma distributions is deteriorated. Under the normal condition, in this stage, a better condition for uniformity is searched by further employing a lot of sample wafers. However, in accordance with the plasma processing apparatus, since a low-cost Si dummy wafer is employed and a test discharging operation is carried out, such a process condition capable of realizing an uniform processing operation can be easily searched without etching of high-cost sample wafers.

Also, in a test discharging operation, an emission distribution as to a single condition is acquired within several seconds, whereas when an actual sample wafer is processed, several tens of minutes per a single condition are required at a minimum in order to acquire an etching result. In other words, since the plasma processing apparatus of this embodiment is employed, cost of sample wafers, developing time, and further, developing staffs, which are required in process development, can be considerably reduced.

Further, the plasma processing apparatus of this embodiment may achieve effects not only in a process developing site in a plasma processing operation, but also in a mass production site. For example, just after such a rest time duration (e.g., maintenance operation for plasma processing apparatus) is continued for a moment, conditioning operation must be carried out with respect to an interior portion of a processing vessel of this plasma processing apparatus. This conditioning operation corresponds to such a discharging operation constituted by several steps with employment of a silicon dummy wafer, and has such a purpose that both a temperature and an atmosphere within a reaction vessel may be approximated to a stationary state. However, even when such a conditioning operation is carried out, in an initial production lot just after a commencement of a mass production lot, there are occasionally such cases that drifts of process operation happen to occur, for instance, a processing speed is varied, and a processing rate distribution within a wafer plane is changed. If conditioning time is prolonged in order to avoid this drift problem, then throughput of the above-described plasma processing apparatus may be lowered.

However, when the plasma processing apparatus of this embodiment is employed, the drifts of the processing rate distribution within the wafer plane can be avoided. In other words, while the uniform emission distribution acquired under the stationary condition where the mass production lot is being processed is previously stored in the system, such a magnetic field control operation may be additionally provided by which the emission distribution in the initial production lot may be approximated to the emission distribution of the uniform emission distribution. In this initial production lot, there are high possibilities that the drifts happen to occur.

Also, if the above-explained inventive idea is applied, then an abnormal event occurred in a mass production line may be detected. That is to say, when an emission distribution is extremely changed from that of the stational condition, a judgment may be made that an abnormal event happens to occur, so that such a measure may be taken, for instance, an apparatus may be stopped. As a result, it is possible to avoid an occurrence of a fail production lot, which is caused by the abnormal event of the apparatus.

Also, since the plasma processing apparatus of this embodiment is employed, a yield may be alternatively improved. As previously explained, in the recent year, process margins as to film forming, exposing process, and etching processes are more and more narrowed in order to allow manufacturing of very fine devices. However, since the plasma processing apparatus of this embodiment is employed, failures can be avoided which are caused by non-uniform processing speeds within wafer planes. Also, non-uniform film thicknesses occurred when films are formed can be corrected. In other words, while a film thickness distribution of a film is previously measured which should be etched and has been formed by way of either a CVD method or a spin coating method, such an etching speed distribution capable of correcting this film thickness distribution may be alternatively set.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. In a plasma processing apparatus comprising:
   a processing vessel, the pressure of which can be lowered;
   a stage for mounting a sample within said processing vessel;
   an antenna electrode having a substantially circular shape, arranged on a plane of the processing vessel, which is located opposite to the stage, and positioned parallel to the stage;
   gas conducting means for supplying processing gas into the processing vessel;
   an external coil which forms a magnetic field within said processing vessel and produces plasma within said processing vessel due to a mutual reaction occurring between the formed magnetic field and an electromagnetic wave radiated from the antenna electrode; and
   an emission monitor for monitoring emission intensity of plasma present in at least 3 different points along a radial direction of said antenna electrode,
   wherein:
      said gas conducting means is comprised of a gas distributing plate and a shower plate, which are arranged in such a manner that both said gas distributing plate and said shower plate cover said antenna electrode, and
      said emission monitor is comprised of an optical fiber which is arranged at a position where said optical fiber faces a narrow hole formed in the shower plate of said gas distributing plate,
   a plasma processing method for plasma-processing said sample by employing said plasma, comprising the steps of:
      monitoring, by said emission monitor, positional distribution of the emission intensity of plasma in the at least 3 different points along the radial direction of said antenna electrode; and
      adjusting, in accordance with the monitored positional distribution of the emission intensity of plasma along the radial direction of said antenna electrode, an energizing current supplied to said external coil in a manner that the magnetic field is strengthened when an emission intensity at a center portion of the plasma is higher than an emission intensity at an outer peripheral portion of the plasma, and the magnetic field is weakened when an emission intensity at the outer peripheral portion of the plasma is higher than an emission intensity at the center portion of the plasma, to thereby uniform the positional distribution of the emission intensity of plasma along the radial direction.

2. A plasma processing apparatus comprising:
   a processing vessel, the pressure of which can be lowered;
   a stage for mounting a sample within said processing vessel;
   an antenna electrode having a substantially circular shape, arranged on a plane of the processing vessel, which is located opposite to the stage, and positioned parallel to the stage;
   gas conducting means for supplying processing gas into the processing vessel;
   an external coil which forms a magnetic field within said processing vessel and produces plasma within said processing vessel due to a mutual reaction occurring between the formed magnetic field and an electromagnetic wave radiated from the antenna electrode; and an emission monitor for monitoring emission intensity of plasma present in at least 3 different points along a radial direction of said antenna electrode, wherein said emission monitor is arranged on a side wall of said processing vessel in such a manner that said emission monitor owns directivities along at least 3 different directions of a center portion, a side edge portion, and an intermediate portion of the produced plasma, a plasma processing method for plasma-processing said sample by employing said plasma, comprising the steps of:

monitoring, by said emission monitor, positional distribution of the emission intensity of plasma in the at least 3 different points along the radial direction of said antenna electrode; and adjusting, in accordance with the monitored positional distribution of the emission intensity of plasma along the radial direction of said antenna electrode, an energizing current supplied to said external coil in a manner that the magnetic field is strengthened when an emission intensity at a center portion of the plasma is higher than an emission intensity at the outer peripheral portion of the plasma, and the magnetic field is weakened when an emission intensity at the outer peripheral portion of the plasma is higher than an emission intensity at the center portion of the plasma, to thereby uniform the positional distribution of the emission intensity of plasma along the radial direction.

* * * * *